United States Patent
McHugh et al.

(10) Patent No.: US 6,574,109 B1
(45) Date of Patent: Jun. 3, 2003

(54) RETAINER DEVICE FOR HEAT SINK ASSEMBLY

(75) Inventors: Robert G. McHugh, Golden, CO (US); Hao-Yun Ma, Tu-Chen (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 10/188,936

(22) Filed: Jul. 3, 2002

(51) Int. Cl.[7] ................................................. H05K 7/20
(52) U.S. Cl. ....................... 361/719; 361/703; 361/704; 257/718; 257/727; 174/16.3; 165/80.3; 26/458; 248/510; 411/522
(58) Field of Search ................................ 361/704, 702, 361/703, 707, 709, 710, 719; 257/718, 722, 727; 174/16.1, 16.3; 165/80.3, 185; 24/457, 458, 520; 248/316.7; 411/516, 522, 523, 520

(56) References Cited

U.S. PATENT DOCUMENTS

| | | | | |
|---|---|---|---|---|
| 5,302,853 A | * | 4/1994 | Volz et al. | 257/707 |
| 5,448,449 A | * | 9/1995 | Bright et al. | 361/704 |
| 5,761,036 A | * | 6/1998 | Hopfer et al. | 361/704 |
| 6,404,633 B1 | * | 6/2002 | Hsu | 361/703 |
| 6,450,248 B1 | * | 9/2002 | Chang | 165/80.3 |
| 6,466,443 B1 | * | 10/2002 | Chen | 361/695 |

FOREIGN PATENT DOCUMENTS

CN            089210547         9/2001

* cited by examiner

*Primary Examiner*—Boris Chervinsky
(74) *Attorney, Agent, or Firm*—Wei Te Chung

(57) ABSTRACT

A retainer device for attaching a heat sink (20) to a CPU (62) includes a retention module (50), a clamp (10), a U-shaped crank holder (30), and a crank (40). The retention module has a rectangular base frame (51), and four posts (52, 54, 56, 58) extending upwardly from corners of the base frame. The clamp has two hinge portions (18) rotatably attached to two rear posts. A hook (22) depends from a front of the clamp. Two pivot rods (32) extend outwardly from opposite ends of the crank holder, and are rotatably received in two corresponding slots (53) defined in two front posts. The crank has an offset pressing portion (42) and an operation rod (46). The pressing portion is disposed between supporting arms (39) of the crank holder. When the operation rod is rotated toward the heat sink and locked in position, the pressing portion presses the hook.

20 Claims, 6 Drawing Sheets

RETAINER DEVICE FOR HEAT SINK ASSEMBLY

BACKGROUND OF THE INVENTION

1. Field of the Invention

The present invention relates to a retainer device for a heat sink assembly, and particularly to a retainer device incorporating a crank to readily and securely retain a heat sink on a central processing unit (CPU) of a computer.

2. Related Art

Heat sinks are often used to dissipate heat from CPUs of computers. Heat sinks can be attached to CPUs in a variety of ways, such as by gluing or using clips. An example of a conventional heat sink assembly is disclosed in Taiwan Patent Application No. 89210547. A clip of such heat sink assembly comprises a pressing portion, two spring portions extending from opposite ends of the pressing portion, and two locking arms depending from distal ends of the spring portions for engaging with a connecting member such as a socket. However, the clip and the connecting member are separate parts. Storage and transportation of these separate parts increases costs.

In addition, developments in integrated circuits have resulted in greater circuit density and complexity, thus increasing heat generated by operation of such integrated circuits within an electronic package such as a CPU. Therefore, bigger and heavier heat sinks are becoming increasingly necessary to efficiently remove the heat. Nowadays, strong resilient clips are often used to attach heat sinks onto electronic devices that incorporate a CPU. Accordingly, the force required to keep a heat sink in place has also increased. Unfortunately, in assembly, operators must exert great manual force when attaching the clip to the socket or to a motherboard. Extra tools are often required for installation or removal of the clip. There is considerable risk that during use of such tools, nearby components such as the motherboard will be accidentally damaged.

Another conventional heat sink assembly comprises a pair of symmetric clips to attach a heat sink to a CPU. The clips have to be attached to a retention module one after the other. Pressing forces applied to two sides of the heat sink are prone to be unequal. This can cause incomplete thermal contact between the heat sink and the CPU, thus reducing the heat dissipating efficiency of the heat sink assembly.

Thus a retainer device that can conveniently and safely secure a heat sink is desired. A copending application with Ser. No. 10/143,589 filed May 9, 2002, and with the same assignee, discloses an approach.

BRIEF SUMMARY OF THE INVENTION

Accordingly, an object of the present invention is to provide a retainer device which can readily and securely attach a heat sink to a heat-generating electronic device such as a CPU.

Another object of the present invention is to provide a retainer device which does not require a tool when the retainer device is manipulated to attach a heat sink to a heat-generating electronic device such as a CPU, or when the retainer device is manipulated to detach the heat sink from the CPU.

A further object of the present invention is to provide a retainer device which applies equal pressing forces to a heat sink.

To achieve the above-mentioned objects, a retainer device for attaching a heat sink to a CPU comprises a retention module, a clamp, a U-shaped crank holder and a crank. The retention module has a rectangular base frame, and four posts extending upwardly from four corners of the base frame. The clamp has a pair of spaced hinge portions rotatably attached to two rear posts of the four posts. A hook depends from a front of the clamp. Two pivot rods extend outwardly from opposite ends of the crank holder, and are rotatably received in two corresponding vertical slots defined in two front posts of the four posts. The crank is substantially L-shaped, and comprises an offset pressing portion, two pivot arms extending from opposite ends of the pressing portion respectively, and an operation rod extending perpendicularly from one end of one of the pivot arms. The pivot arms are pivotably received in supporting arms of the crank holder, with the pressing portion being disposed between the supporting arms. When the operation rod is rotated toward the heat sink and locked in position, the pressing portion presses the hook of the clamp. The clamp accordingly pushes the heat sink toward the CPU, thereby causing the heat sink to intimately engage with the CPU. To release the heat sink from intimate engagement with the CPU, the operation rod is unlocked, whereupon the pressing portion of the crank is released from pressing engagement with the hook of the clamp.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
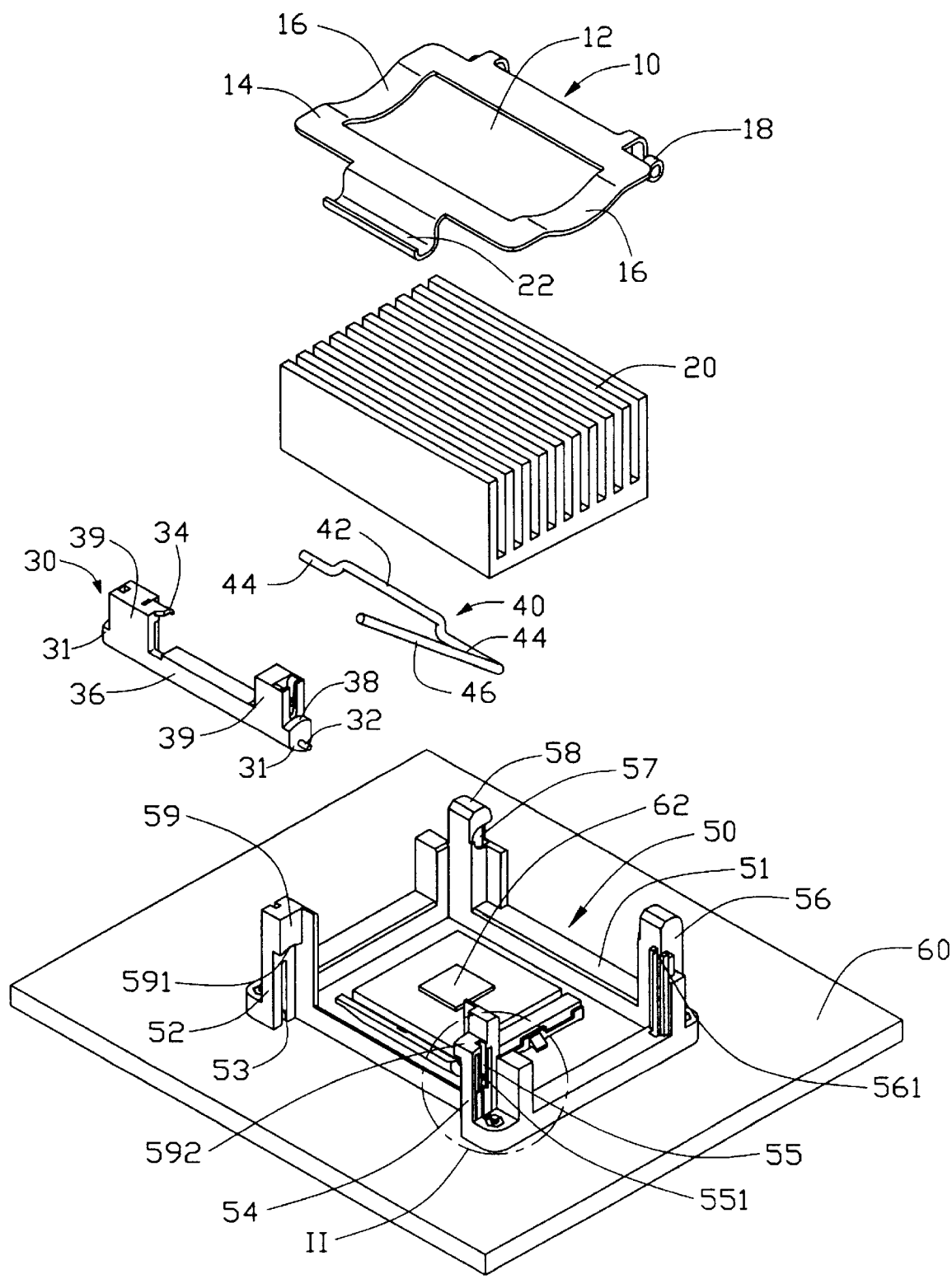
FIG. 1 is an exploded perspective view of a retainer device in accordance with the present invention, together with a heat sink, a CPU, a CPU socket and a motherboard.
Figure 2:
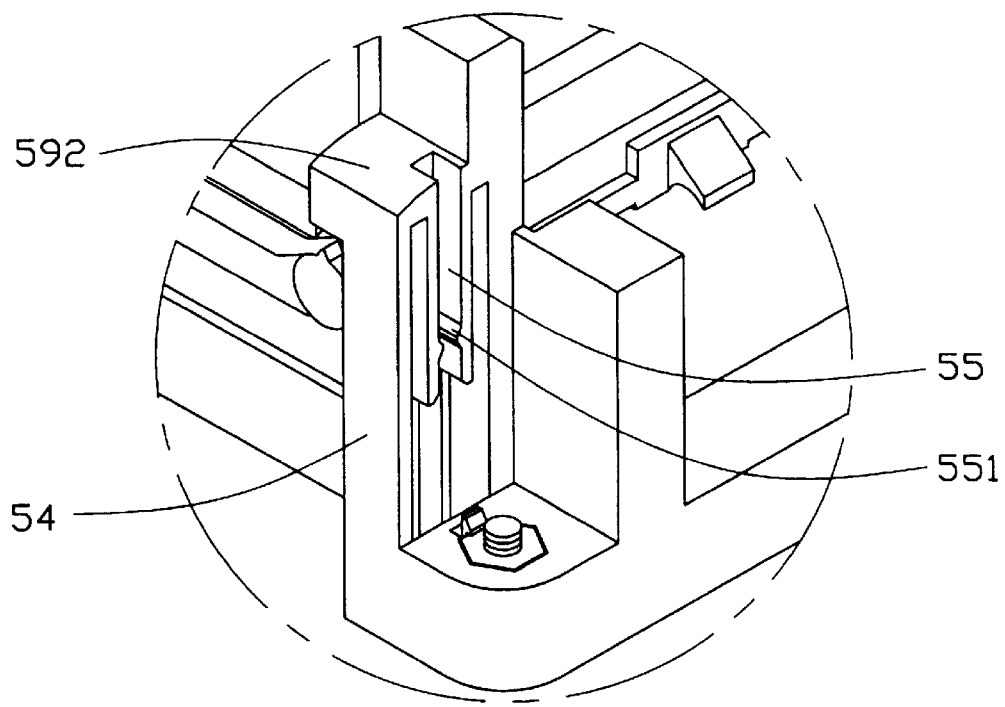
FIG. 2 is an enlarged perspective view of an encircled portion II of FIG. 1.
Figure 3:
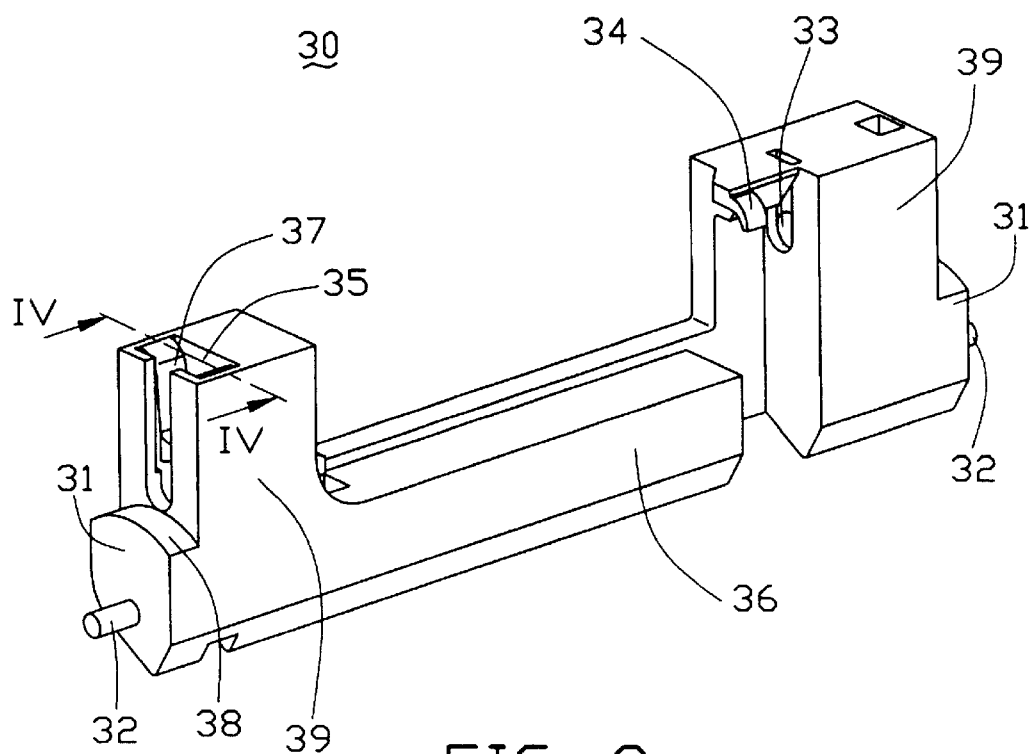
FIG. 3 is an enlarged perspective view of a crank holder of the retainer device of FIG. 1, viewed from another aspect.
Figure 4:
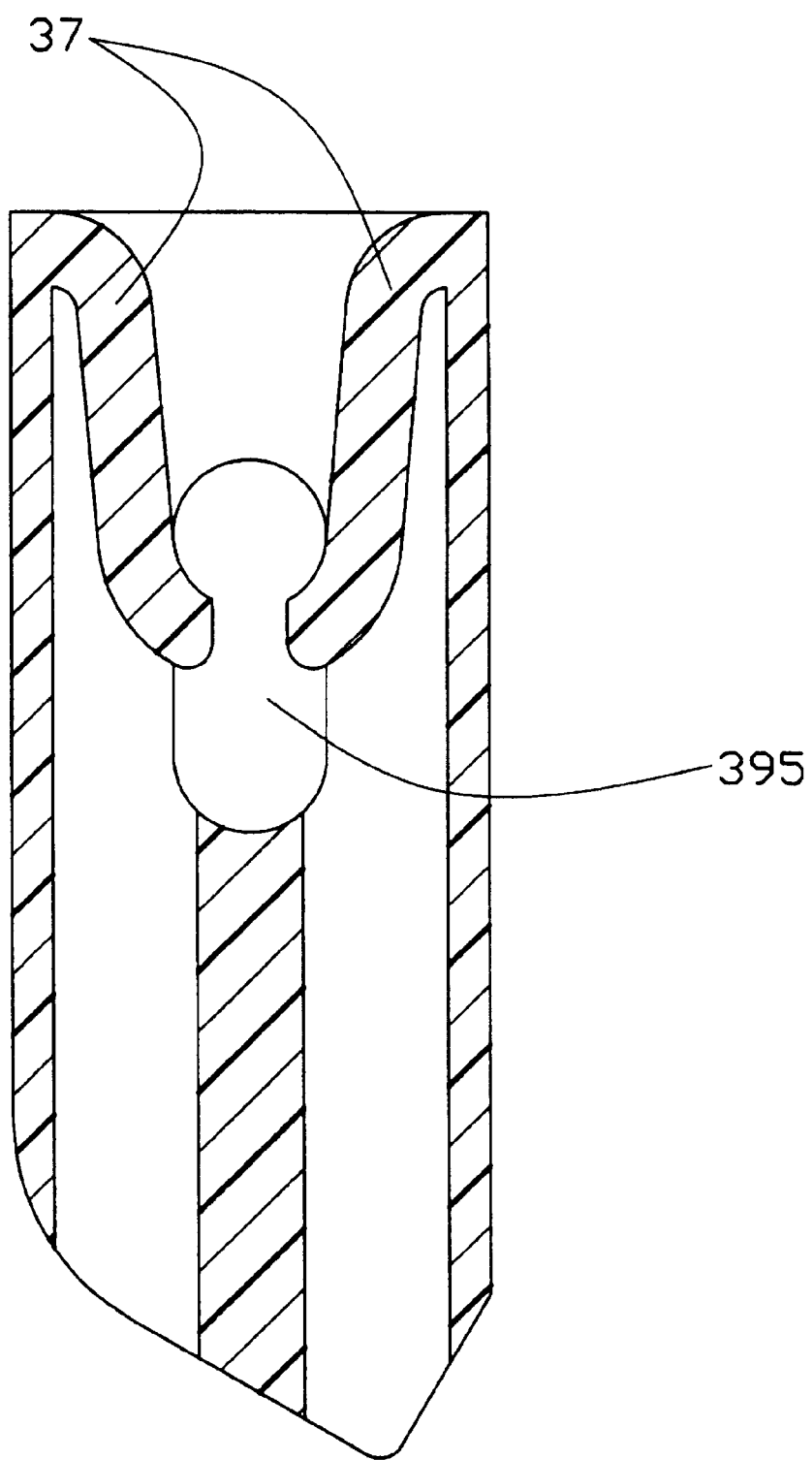
FIG. 4 is an enlarged cross-sectional view taken along line IV—IV of FIG. 3.

Referring to FIGS. 1–4, a retainer device in accordance with the present invention includes a retention module 50, a clamp 10, a crank holder 30 and a crank 40. The retainer device is used to attach a heat sink 20 to a CPU 62 mounted on a motherboard 60.

The retention module 50 comprises a rectangular base frame 51 surrounding the CPU 62. The retention module 50 further comprises a first post 52, a second post 54, a third post 56 and a fourth post 58 extending upwardly from four corners of the base frame 51 respectively. The base frame 51 is mounted to the motherboard 60, with four bolts (not labeled) extending through the four corners of the base frame 51. A vertical slot 53 is defined in each of lower portions of inner side walls of the first and second posts 52, 54. Two opposing resilient ribs 55 extend from an upper portion of an outer side of each of the first and second posts 52, 54. Two lugs 551 extend toward each other from respective end portions of the two opposing resilient ribs 55. Two opposing protrusions 59 are formed at upper portions of the first and second posts 52, 54 respectively. A lower surface 591 of each protrusion 59 is concave. An upper extremity of the protrusion 59 of the second post 54 is lower than an upper extremity of the protrusion 59 of the first post 52, and forms a supporting surface 592 thereon. Two opposing arch-shaped recesses 57. (only one labeled) are respectively defined in upper portions of inner side walls of the third and fourth posts 56, 58. A locking portion 561 is formed at the third post 56, and is adapted to retain the crank 40. The locking portion 561 may comprise, for example, two resiliently deformable arms.

The clamp 10 is for pressing the heat sink 20, and comprises a generally rectangular frame 14, a pair of spaced hinge portions 18 formed at a rear of the frame 14, and a hook 22 depending from a front of the frame 14 and then extending outwardly and upwardly. An opening 12 is defined in a middle of the frame 14, for facilitating ventilation of the heat sink 20. The frame 14 has a curved portion 16 at each of opposite lateral sides thereof, for providing resiliency. The hinge portions 18 correspond to the recesses 57 of the retention module 50.

The crank holder 30 is generally U-shaped. The crank holder 30 includes a base 36, and two supporting arms 39 perpendicularly extending from opposite ends of the base 36 in a same direction. A pair of protruding portions 31 extends horizontally outwardly in opposite directions from opposite lateral ends of the base 36 respectively. A pivot rod 32 extends horizontally outwardly from an end face of each protruding portion 31, for being received in the corresponding slot 53 of the retention module 50. A convex surface 38 is formed on an upper extremity of each protruding portion 31, complementary to the lower surface 591 of the corresponding protrusion 59 of the retention module 50. A pivot hole 33 is defined in an upper portion of one supporting arm 39. An arcuate catch 34 is formed on that supporting arm 39 next to the pivot hole 33. A through hole 395 and a retaining slot 35 are defined in the other supporting arm 39. The through hole 395 is in communication with the retaining slot 35. A pair of symmetrically opposite resilient restricting tabs 37 is formed in the retaining slot 35. The restricting tabs 37 depend from an upper portion of said other supporting arm 39.

The crank 40 includes an offset pressing portion 42, two pivot arms 44 extending from opposite ends of the pressing portion 42 respectively, and an operation rod 46 extending perpendicularly from one end of one of the pivot arms 44. The operation rod 46 facilitates operation of the crank 40.

Figure 5:
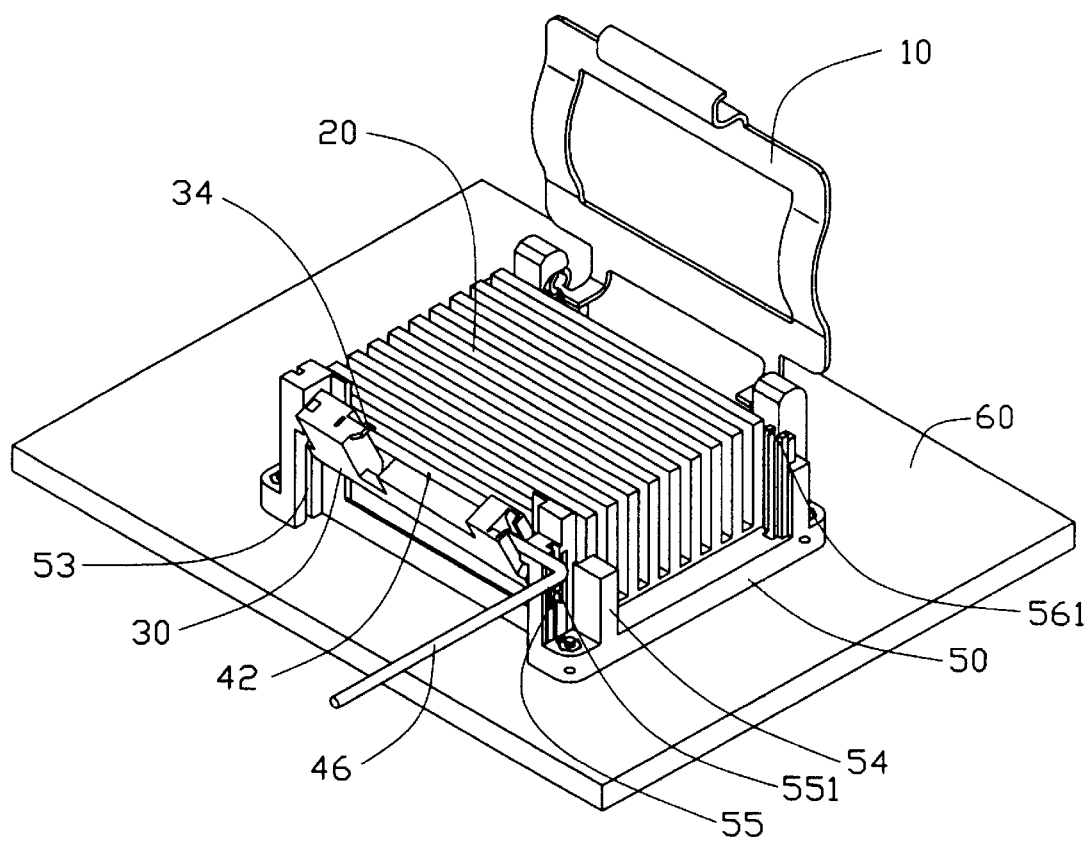
FIGS. 5 and 6 are partly assembled views of FIG. 1, showing successive stages in the process of assembling the components shown in FIG. 1.
Figure 6:
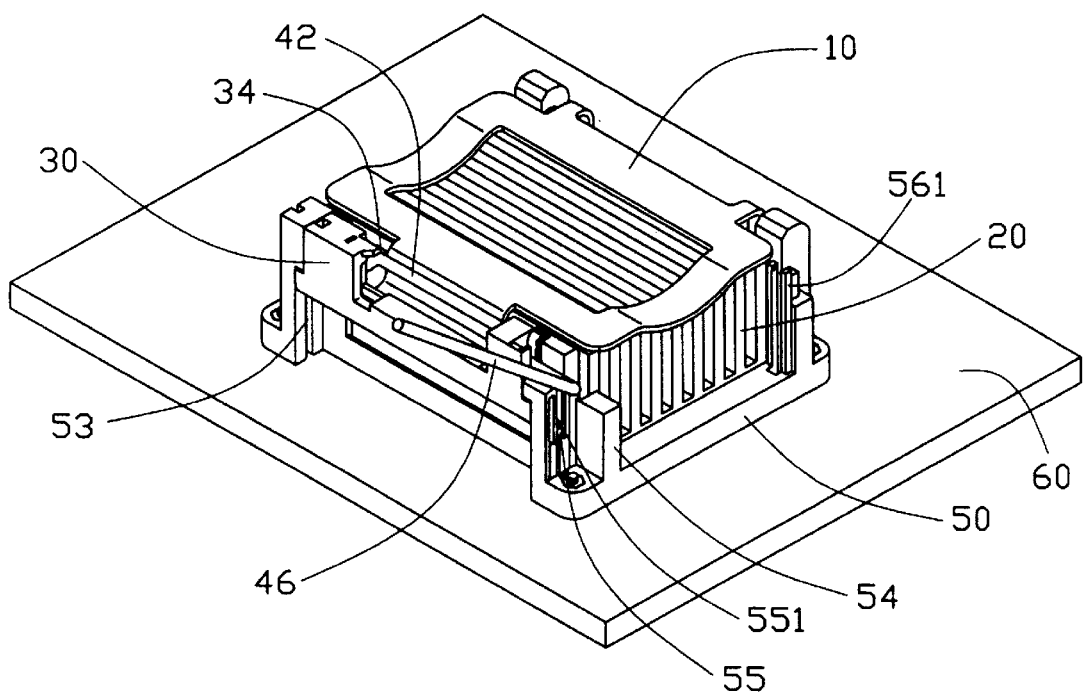
Figure 7:
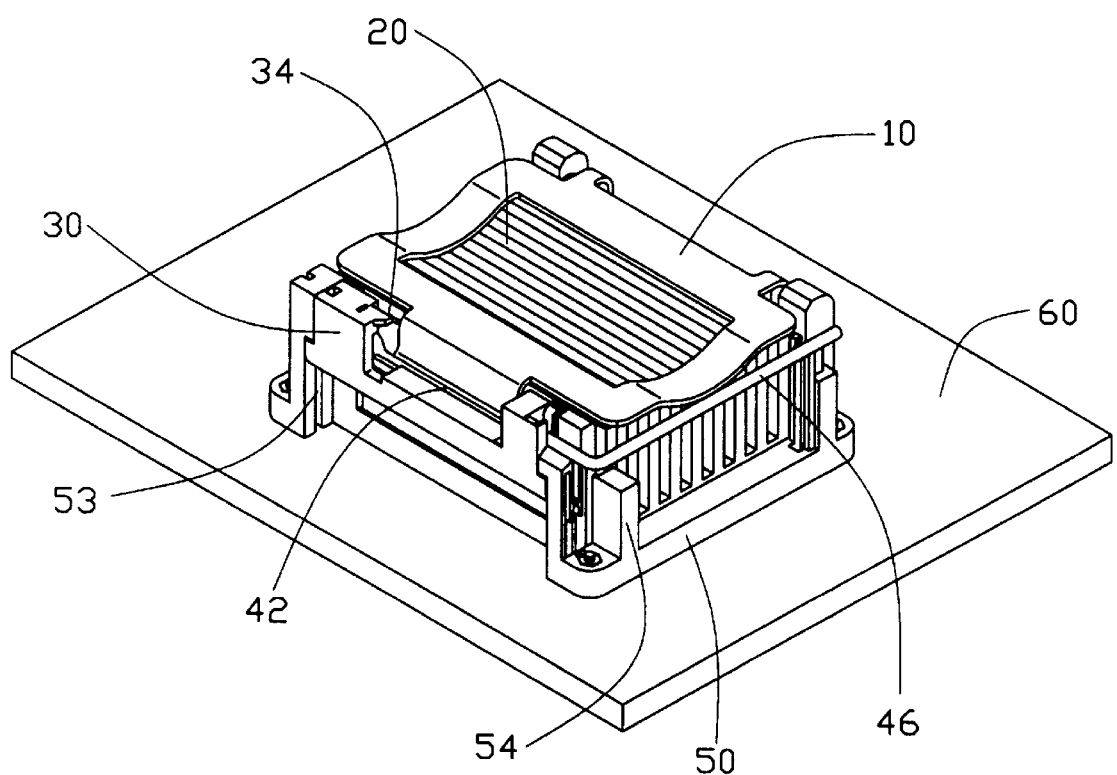
FIG. 7 is a fully assembled view of FIG. 1.

Referring also to FIGS. 5–7, in assembly of the retainer device, the hinge portions 18 of the clamp 10 are rotatably received in the recesses 57 of the third and fourth posts 56, 58 of the retention module 50. The clamp 10 is oriented vertically, and can rotate about the third and fourth posts 56, 58 of the retention module 50. A distal one of the pivot arms 44 and the pressing portion 42 of the crank 40 are extended through the through hole 395 of the crank holder:30, and the distal pivot arm 44 is pivotably received in the pivot hole 33 of the crank holder 30. A proximal one of the pivot arms 44 is pivotably retained between the two restricting tabs 37 of the retaining slot 35. The pressing portion 42 is disposed between the two supporting arms 39. The pivot rods 32 of the crank holder 30 are rotatably received in the slots 53 of the retention module 50. The pivot rods 32 are supported by the lugs 551 of the resilient ribs 55 of the first and second posts 52, 54. The operation rod 46 extends away from the heat sink 20. In this position (see FIG. 5), the crank holder 30 is slanted away the heat sink 20, such that a top portion of the crank holder 30 is farthest from the heat sink 20. The pressing portion 42 of the crank 40 is at a high position in which the pressing portion 42 is engaged with the arcuate catch 34 of the crank holder 30. Thus the crank 40 is held in position; and when the crank 40 is later rotated toward the heat sink 20, the crank holder 30 rotates correspondingly.

The clamp 10 is then rotated down toward the heat sink 20. The hook 22 thereby enters a space (not labeled) generally between the crank 60 and the base 36 of the crank holder 30 (see FIG. 6). The operation rod 46 of the crank 40 is then rotated upwardly and toward the heat sink 20. Because the crank 40 is engaged with the arcuate catch 34, the crank 40 drives the crank holder 30 to rotate toward the heat sink 20 in unison. When the crank holder 30 reaches a vertical orientation and abuts against stops (not labeled) of the first and second posts 52, 54, the crank 40 is released from engagement with the arcuate catch 34 and continues rotating until the operation rod 46 reaches a substantially horizontal position alongside the heat sink 20. Thereupon the operation rod 46 is locked in the locking portion 561 of the third post 56 (see FIG. 7). The pressing portion 42 of the crank 40 is at a lowest location, and resiliently presses the hook 22 downwardly. The clamp 10 thereby securely attaches the heat sink 20 to the CPU 62.

To release the heat sink 20 from intimate engagement with the CPU 62, the operation rod 46 is unlocked from the locking portion 561, whereupon the pressing portion 42 of the crank 40 is released from pressing engagement with the hook 22 of the clamp 10.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A retainer device for fastening a heat sink to a heat-generating electronic device mounted on a circuit board, the retainer device comprising:

a retention module adapted to be placed around the heat-generating electronic device, the retention module having a base frame and a plurality of posts extending upwardly from the base frame;

a clamp rotatably attached to one side of the retention module;

a crank holder being pivotably attached to an opposite side of the retention module; and a crank movably attached to the crank holder, the crank pressing the clamp whereby the clamp attaches the heat sink to the heat-generating electronic device.

2. The retention device as described in claim 1, wherein the clamp has a hooking portion at a free side thereof, and the crank presses the hooking portion of the clamp to attach the heat sink to the heat-generating electronic device.

3. The retention device as described in claim 1, wherein two recesses are defined in two opposite inner sides of two rearmost posts of the retention module, for movably receiving two hinge portions of the clamp.

4. The retention device as described in claim 1, wherein two slots are defined in two opposite inner sides of two frontmost posts of the retention module, and two pivot rods extend outwardly from opposite ends of the crank holder and are pivotably received in the corresponding slots of the retention module.

5. The retention device as described in claim 4, wherein a pair of opposing lugs is arranged at each of the slots of the retention module, for supporting a corresponding pivot rod of the crank holder.

6. The retention device as described in claim 4, wherein two opposing protrusions are formed at upper portions of the frontmost posts of the retention module, and each of the protrusions comprises a concave surface at a bottom thereof.

7. The retention device as described in claim 6, wherein the crank holder has a base, a pair of supporting arms extending substantially perpendicularly from opposite ends of the base, and two protruding portions extending horizontally in opposite directions from the opposite ends of the base, and wherein each of the protruding portions comprises a convex surface at a top thereof complementary to the concave surface of the protrusion of a corresponding post, and the pivot rods extend outwardly from opposite outer faces of the protruding portions.

8. The retention device as described in claim 7, wherein a through hole and a retaining slot are defined in one of the supporting arms of the crank holder for extension of the crank therethrough and for pivotably receiving a part of the crank therein respectively, and a pivot hole is defined in the other of the supporting arms for pivotably receiving an end of the crank therein.

9. The retention device as described in claim 8, wherein the through hole is in communication with the retaining slot, a pair of restricting tabs is formed in the retaining slot, and the restricting tabs depend from an upper portion of said one of the supporting arms.

10. The retention device as described in claim 8, wherein a catch is arranged on the crank holder next to the pivot hole, to releasably engage the crank.

11. The retention device as described in claim 1, wherein the crank comprises an operation portion for facilitating operation.

12. The retention device as described in claim 11, wherein the crank further comprises an offset pressing portion and two pivot arms extending from opposite ends of the pressing portion, and the operation portion of the crank extends from an end of one of the pivot arms.

13. The retention device as described in claim 1, wherein the clamp has curved portions for providing resiliency.

14. A heat dissipating assembly, comprising:
a circuit board;
an electronic device mounted on the circuit board;
a heat sink attached to the electronic device;
a retention module attached to the motherboard and substantially surrounding the electronic device, the retention module having a base frame and a plurality of posts extending upwardly from the base frame;
a clamp hingedly attached to a rear of the retention module, a hooking portion depending from a free side of the clamp; and
a crank holder pivotably attached to a front of the retention module, the crank holder having a crank pivotably and transversely retained therein, the crank having an offset pressing portion, two pivot arms, and an operation rod extending from an end of one of the pivot arms; wherein
the operation rod is pivoted to make the pressing portion of the crank locate at a lowest position and press the hooking portion of the clamp.

15. The heat dissipating assembly as described in claim 14, wherein the crank holder has two pivot rods at opposite ends thereof, and the pivot rods are movably received in two opposing slots of two of the posts of the retention module.

16. The heat dissipating assembly as described in claim 14, wherein a catch is arranged at the crank holder, for releasably engaging the crank.

17. The heat dissipating assembly as described in claim 16, wherein in a preliminary position the crank holder is slanted relative to the posts of the retention module, and when the operation rod of the crank is rotated toward the heat sink, the crank drives the crank holder to rotate accordingly until the crank holder reaches a substantially vertical orientation, whereupon the crank is released from engagement with the catch and can continue rotating.

18. The heat dissipating assembly as described in claim 14, wherein when the operation rod is pivoted to a position alongside the heat sink, the pressing portion presses the hooking portion of the clamp.

19. The heat sink assembly as described in claim 14, wherein the clamp has curved portions for providing resiliency.

20. A retainer device comprising:
a retention module defining two opposite sides;
a clamp pivotally mounted on one of said two sides with a distal portion extending away from said one of the two sides;
a crank holder moveable mounted on the other of said two sides, said crank holder defining open and closed positions; and
a crank moveable attached to the crank holder; wherein initially the crank holder is arranged to be in the open position to allow the distal portion of the clamp to pivotally approach until the clamp is located in a horizontal position, said crank holder successively is actuated to be in the closed position by engagement with said distal portion of the clamp, and finally the crank is moved relative to the crank holder to abut against the distal portion of said clamp so as to hold both the clamp and said crank holder in position relative to the retention module.

* * * * *